(12) United States Patent
Baldwin et al.

(10) Patent No.: US 9,114,601 B2
(45) Date of Patent: Aug. 25, 2015

(54) CLEAN FLEXOGRAPHIC PRINTING PLATE AND METHOD OF MAKING THE SAME

(76) Inventors: Kyle P. Baldwin, Acworth, GA (US); Miguel A. Barboza, Fairburn, GA (US)

( * ) Notice: Subject to any disclaimer, the term of this patent is extended or adjusted under 35 U.S.C. 154(b) by 781 days.

(21) Appl. No.: 13/409,374

(22) Filed: Mar. 1, 2012

(65) Prior Publication Data
US 2013/0228086 A1    Sep. 5, 2013

(51) Int. Cl.
*B41C 3/00* (2006.01)
*B41C 1/05* (2006.01)
*B41N 1/00* (2006.01)
*G03F 7/027* (2006.01)
*G03F 7/075* (2006.01)
*G03F 7/095* (2006.01)
*G03F 7/11* (2006.01)
*G03F 7/20* (2006.01)

(52) U.S. Cl.
CPC . *B41C 1/05* (2013.01); *B41N 1/003* (2013.01); *G03F 7/027* (2013.01); *G03F 7/0755* (2013.01); *G03F 7/0757* (2013.01); *G03F 7/095* (2013.01); *G03F 7/11* (2013.01); *G03F 7/202* (2013.01); *G03F 7/2022* (2013.01)

(58) Field of Classification Search
CPC .......... B41C 3/00; B41C 1/1016; B41M 1/04; G03F 7/2012; G03F 7/2002; G03F 7/20
USPC ........................................................ 101/401
See application file for complete search history.

(56) References Cited

U.S. PATENT DOCUMENTS

| | | |
|---|---|---|
| 3,265,765 A | 8/1966 | Holden et al. |
| 3,867,153 A | 2/1975 | MacLachlan |
| 3,877,939 A | 4/1975 | Okai |
| 4,264,705 A | 4/1981 | Allen |
| 4,320,188 A | 3/1982 | Heinz et al. |
| 4,323,636 A | 4/1982 | Chen |
| 4,323,637 A | 4/1982 | Chen et al. |
| 4,369,246 A | 1/1983 | Chen et al. |
| 4,423,135 A | 12/1983 | Chen et al. |
| 4,427,759 A | 1/1984 | Gruetzmacher et al. |
| 4,427,761 A | 1/1984 | Charles |
| 4,622,088 A | 11/1986 | Min |
| 5,135,827 A | 8/1992 | Bohm et al. |
| 5,223,375 A | 6/1993 | Berrier et al. |
| 5,262,275 A | 11/1993 | Fan |
| 5,543,231 A | 8/1996 | Kidon et al. |
| 5,925,500 A | 7/1999 | Yang |
| 6,048,587 A | 4/2000 | Estrin |
| 6,238,837 B1 | 5/2001 | Fan |
| 6,403,269 B1 | 6/2002 | Leach |
| 6,609,459 B1 * | 8/2003 | Figov ............................ 101/150 |
| 6,734,221 B1 | 5/2004 | Mislak |
| 7,841,277 B1 | 11/2010 | Van Denend |
| 7,856,926 B2 | 12/2010 | Thal |
| 7,901,863 B2 | 3/2011 | Yamada et al. |
| 7,947,427 B2 | 5/2011 | Bryant et al. |
| 8,114,566 B2 | 2/2012 | Araki et al. |
| 2006/0105268 A1 | 5/2006 | Vest |
| 2006/0281024 A1 * | 12/2006 | Bryant et al. .............. 430/270.1 |
| 2007/0122748 A1 | 5/2007 | Bryant et al. |
| 2009/0081421 A1 * | 3/2009 | Kakino ....................... 428/195.1 |
| 2009/0117489 A1 * | 5/2009 | Wang et al. ................ 430/270.1 |
| 2009/0176176 A1 * | 7/2009 | Araki et al. ................ 430/286.1 |
| 2010/0009285 A1 * | 1/2010 | Daems et al. .............. 430/270.1 |
| 2010/0196827 A1 | 8/2010 | Leenders et al. |

FOREIGN PATENT DOCUMENTS

| | | |
|---|---|---|
| EP | 0 456 336 | 11/1991 |
| EP | 0 640 878 | 3/1995 |
| GB | 1 366 769 | 9/1974 |

\* cited by examiner

*Primary Examiner* — Blake A Tankersley
*Assistant Examiner* — Quang X Nguyen
(74) *Attorney, Agent, or Firm* — Carmody Torrance Sandak & Hennessey LLP

(57) ABSTRACT

A clean running flexographic relief image printing element and a method of making the same is described. The relief image printing element comprises (a) a backing layer; (b) a floor layer disposed on the backing layer and comprising a photopolymer containing a silicone monomer or silicone oil, wherein the cured floor layer has a surface energy of between about 18 to about 25 dynes/cm; (c) a cap layer disposed on the floor layer and comprising a photocurable composition that is capable of being imagewise exposed to actinic radiation to create a relief image therein, wherein the cap layer has a surface energy of between about 30 and about 40 dynes/cm; and (d) a removable cover sheet. The differential of surface energies between the floor layer and the cap layer increases how clean the plate will print over time.

19 Claims, No Drawings

CLEAN FLEXOGRAPHIC PRINTING PLATE AND METHOD OF MAKING THE SAME

FIELD OF THE INVENTION

The present invention relates generally to the production of flexographic printing plates that are capable of printing cleanly.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

In flexographic printing, ink is transferred from a pool of ink to a substrate by way of a printing plate. The surface of the plate is shaped so that the image to be printed appears in relief, in the same way that rubber stamps are cut so as to have the printed image appear in relief on the surface of the rubber. Typically, the plate is mounted on a cylinder, and the cylinder rotates at a high speed such that the raised surface of the printing plate contacts a pool of ink, is slightly wetted by the ink, then exits the ink pool and contacts a substrate material, thereby transferring ink from the raised surface of the plate to the substrate material to form a printed substrate. Those involved in the flexographic printing industry are constantly striving to improve the flexographic printing process in order to more effectively compete.

The demands placed on flexographic printing plates are numerous. Firstly, a flexographic printing plate must have sufficient flexibility to wrap around a printing cylinder, yet be strong enough to withstand the rigors experienced during typical printing processes. Furthermore, the printing plate should possess a low hardness to facilitate ink transfer during printing. In addition, it is important that the surface of the printing plate remain dimensionally stable during storage.

It is required that the printing plate have a relief image that has a chemical resistance to the ink which is used. It is also necessary that the physical and printing properties of the printing plate are stable and do not change during printing. Finally, in order to maintain high quality and clear printing during a run, it is highly desirable that a printing plate not pick up deposits of paper fibers and dried ink which tend to fill in reverse areas of the plate and deposit at the edges of the printing areas of the plate. When plates pick up excessive deposits during printing, the printing press must be shut down periodically during the run to clean the plates, resulting in a loss of productivity.

Flexographic printing plates which have less of a tendency to accumulate ink during use has been sought for many years, with limited success. The inherent need for the plate to accept ink on its relief surface has often conflicted with attempts to limit its accumulation on other parts of the plate during use. Various attempts have been made to create clean relief image printing plates through modifications of the plate chemistry. However, none of these attempts has been very successful, often producing hazy plates that did not image very well, or which failed to prevent the accumulation of ink.

A typical flexographic printing plate as delivered by its manufacturer is a multilayered article made of a backing (or support) layer; one or more unexposed photocurable layers; a protective layer or slip film; and often a protective cover sheet.

The backing layer lends support to the plate and can be formed from a transparent or opaque material such as paper, cellulose film, plastic, or metal. The photopolymer layer(s) can include any of the known binders (oligomers), monomers, initiators, reactive or non-reactive diluents, fillers, and dyes. The term "photocurable" or "photopolymer" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photopolymer materials include an elastomeric compound (binder), an ethylenically unsaturated compound having at least one terminal ethylene group, and a photoinitiator. More than one photocurable layer may also be used.

The photopolymer materials generally cross-link (cure) and harden through radical polymerization in at least some actinic wavelength region. As used herein, actinic radiation is radiation capable of effecting a chemical change in an exposed moiety. Actinic radiation includes, for example, amplified (e.g., laser) and non-amplified light, particularly in the UV and violet wavelength regions.

Many different elastomeric materials have been investigated for the preparation of the photopolymer plates. These include polyamide-based photopolymer (containing a polyamide as an essential component) which dissolves or swells in a washout solution (typically, water, alkaline aqueous solution, or an alcohol), a polyvinyl alcohol-based photopolymer (containing polyvinyl alcohol as an essential component), a polyester-based photopolymer (containing a low-molecular weight unsaturated polyester as an essential component), an acrylic-based photopolymer (containing a low-molecular weight acrylic polymer as an essential component), a butadiene copolymer-based photopolymer (containing a butadiene or isoprene/styrene copolymer as an essential component), or a polyurethane-based photopolymer (containing polyurethane as an essential component).

A slip film is a thin layer, which rests upon and protects the photopolymer from dust and increases its ease of handling. In a conventional ("analog") plate making process, the slip film is transparent to UV light. The printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. Instead of a slip film, a matte layer may also be used to improve the ease of plate handling. The matte layer typically comprises fine particles (silica or similar) suspended in an aqueous binder solution. The matte layer is coated onto the photopolymer layer and then allowed to air dry. A negative is then placed on the matte layer for subsequent UV-flood exposure of the photocurable layer.

In a "digital" or "direct to plate" plate making process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are ablated by exposing the masking layer to laser radiation at a selected wavelength and power of the laser. Examples of laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety.

After imaging, the photosensitive printing element is developed to remove the unpolymerized portions of the layer of photopolymer material and reveal the crosslinked relief image in the cured photosensitive printing element. Typical methods of development include washing with various solvents or water, often with a brush. Other possibilities for development include the use of an air knife or heat plus a blotter (i.e. thermal development). The resulting surface has a relief pattern that reproduces the image to be printed. The relief pattern typically comprises a plurality of dots, and the shape of the dots and the depth of the relief, among other factors, affect the quality of the printed image. After the relief image is developed, the relief image printing element may be mounted on a press and printing commenced.

It is also desirable to formulate an improved sheet photopolymer composition that is a solid at room temperature and that is capable of printing more cleanly and without picking up significant amounts of paper fibers, dust and ink during a print run.

SUMMARY THE INVENTION

It is an object of the present invention to provide an improved sheet polymer plate construction that is capable of printing cleanly during a print run.

It is another object of the present invention to provide an improved method of constructing sheet polymer printing plates.

It is still another object of the present invention to create a clean printing plate by selectively adjusting the surface energy of the floor of the printing plate versus the printing surface.

To that end, in one embodiment, the present invention relates generally to a flexographic relief image printing element comprising:
  a) a backing layer;
  b) a first photopolymer layer disposed on the backing layer and comprising a first photopolymer containing a silicone monomer or silicone oil;
  c) a second photopolymer layer disposed on the first photopolymer layer preferably and comprising a second photopolymer that is capable of being imagewise exposed to actinic radiation to create a relief image therein, wherein the second photopolymer layer preferably has a surface energy at least 5 dynes/cm higher than the surface energy of the first photopolymer layer when they are cured; and
  d) optionally, a laser ablatable mask layer disposed on the second photopolymer layer; and
  e) a removable cover sheet.

In another embodiment, the present invention relates generally to a method of making a flexographic relief image printing plate, the method comprising the steps of:
  a) disposing a first photopolymer onto a backing layer, wherein the first photopolymer comprises a silicone monomer or silicone oil therein;
  b) disposing a second photopolymer on top of the first photocurable composition;
  c) exposing the printing plate to actinic radiation through the backing layer to at least partially cure the first photopolymer thereby creating a floor; and d) imagewise exposing the second photopolymer to actinic radiation from its exposed upper surface to create the relief image therein.

DETAILED DESCRIPTION OF THE PREFERRED EMBODIMENTS

The present invention relates generally to improved sheet polymer compositions that are usable in the production of flexographic printing blanks to produce relief image printing plates and that are capable of printing more cleanly and without picking up significant amounts of paper fibers, dust and ink during printing runs. In particular, the present invention relates generally to flexographic relief image printing elements that have silicone incorporated into the matrix of a sheet polymer for use as the floor layer of the relief image printing element, and potentially a portion of the relief.

Typically, silicones are bad for printing performance because their presence induces a lack of ink transfer. However, in the present invention, the inventors have discovered that it is possible to produce a printing plate that comprises a first photopolymer layer made up of the silicone bound material and an imageable cap layer that is imaged and exposed to actinic radiation to create the relief image therein. The result is a printing plate that has a high differential of surface energies between the first photopolymer layer and the cap layer that increases how clean the plate will print over time. The floor layer comprises a silicone bound into the network of a photopolymer.

In a preferred embodiment, the present invention relates generally to a flexographic relief image printing element comprising:
  a) a backing layer;
  b) a first photopolymer layer disposed on the backing layer comprising a first photopolymer containing a silicone monomer or silicone oil;
  c) a second photopolymer layer disposed on the first photopolymer layer and comprising a second photopolymer composition that is capable of being imagewise exposed to actinic radiation to create a relief image therein, wherein the second photopolymer layer has a surface energy at least 5 dynes/cm higher than the surface energy of the first photopolymer layer when the layers are cured; and
  d) optionally, a laser ablatable mask layer disposed on the second photopolymer layer; and
  e) a removable cover sheet.

More preferably, the surface energy of the second photopolymer layer is between about 30 to about 40 dynes/cm and the surface energy of the first photopolymer layer is between about 18 to about 25 dynes/cm, in both cases when cured.

In another preferred embodiment, the present invention relates generally to a method of making a flexographic relief image printing plate, the method comprising the steps of:
  a) disposing a first photopolymer onto a backing layer, wherein the first photopolymer comprises a silicone monomer or silicone oil therein;
  b) disposing a second photopolymer on top of the first photopolymer;
  c) exposing the printing plate to actinic radiation through the backing layer to at least partially cure the first photopolymer thereby creating a floor and;
  d) imagewise exposing the second photopolymer to actinic radiation from the exposed upper surface to create the relief image therein.

The first photopolymer generally comprises a photocurable material which may be the same as or similar to the second photopolymer. However, as described herein, the second photopolymer does not contain a silicone monomer or silicone or contains only negligible amounts of these compounds. The photocurable material comprising the first photopolymer and the second photopolymer can include any of the known oligomers or binders, monomers, initiators, reactive diluents, filters, and dyes. Preferred photopolymer materials include an elastomeric compound (binder), an ethylenically unsaturated compound having at least one terminal ethylene group, and a photoinitiator. Exemplary photopolymer materials are disclosed in European Patent Applications 0 456 336 A2 (Goss, et al.), and 0 640 878 A1 (Goss, et al.), British Patent No. 1,366,769, U.S. Pat. No. 5,223,375 (Berrier, et al.), U.S. Pat. No. 3,867,153 (MacLahan), U.S. Pat. No. 4,264,705 (Allen), U.S. Pat. No. 4,323,636 (Chen, et al.), U.S. Pat. No. 4,323,637 (Chen, et al.), U.S. Pat. No. 4,369,246 (Chen, et al.), U.S. Pat. No. 4,423,135 (Chen, et al.), U.S. Pat. No. 3,265,765 (Holden, et al.), U.S. Pat. No. 4,320,188 (Heinz, et al.), U.S. Pat. No. 4,427,759 (Gruetzmacher, et al.), U.S. Pat. No. 4,622,088 (Min), and U.S. Pat. No. 5,135,827 (Bohm, et al.), the subject matter of each of which is herein incorporated by reference in its entirety.

As used herein, the term "photopolymer" refers to a composition which undergoes polymerization, cross-linking, or any other curing or hardening reaction in response to actinic radiation with the result that the unexposed portions of the material can be selectively separated and removed from the exposed (cured) portions to form a three dimensional or relief pattern of cured material. In addition, the floor layer is produced by subjecting the first photopolymer to a blanket exposure to actinic radiation for a sufficient period of time to cure at least a portion of the first photopolymer, thus creating the "floor" layer. Any uncured portion of the first photopolymer will be imagewise cured when the second photopolymer is imagewise cured to form the relief.

The photocurable material for both the first photopolymer and the second photopolymer preferably comprises at least one ethylenically unsaturated monomer. Suitable monomers include, for example, multifunctional acrylates, multifunctional methacrylates and polyacryloyl oligomers. Examples of suitable monomers include one or more of ethylene glycol diacrylate, hexanediol diacrylate, diethylene glycol diacrylate, glycerol diacrylate, trimethylol propane triacrylate, hexane diol dimethacrylate, glycerol triacrylate, trimethylolpropane triacrylate, ethylene glycol dimethacrylate, 1,3-propanediol dimethacrylate, 1,2,4-butanetriol trimethacrylate, 1,4-butanediol diacrylate, and combinations of one or more of the foregoing. In a preferred embodiment, the ethylenically unsaturated monomer comprises trimethylol propane triacrylate.

The photo-initiator absorbs light and is responsible for the production of free radicals or cations. Free radicals or cations are high-energy species that induce polymerization. Suitable photoinitiators for use in the first photocurable composition and the second photocurable composition of the present invention include quinones, benzophenone and substituted benzophenones, hydroxyl alkyl phenyl acetophenones, dialkoxy acetophenones such as 2,2-diethoxyacetophenone and 2,2-dimethoxy-2-phenyl acetophenone, α-halogeno-acetophenones, aryl ketones (such as 1-hydroxycyclohexyl phenyl ketone), 2-hydroxy-2-methyl-1-phenylpropan-1-one, 2-benzyl-2-dimethylamino-(4-morpholinophenyl)butan-1-one, thioxanthones (such as isopropylthioxanthone), benzil dimethylketal, bis (2,6-dimethyl benzoyl)-2,4,4-trimethylpentylphosphine oxide, trimethylbenzoyl phosphine oxide derivatives such as 2,4,6trimethylbenzoyldiphenylphosphine oxide, methyl thio phenylmorpholino ketones such as 2-methyl-1-[4-(methylthio)phenyl]-2-morpholinopropan-1-one, morpholino phenyl amino ketones, 2,2-dimethoxy-1,2-diphenylethan-1-one or 5,7-diiodo-3-butoxy-6-fluorone, diphenyliodonium fluoride and triphenyisulfonium hexafluophosphate, benzoin ethers, peroxides, biimidazoles, benzyl dimethyl ketal, aminoketones, benzoyl cyclohexanol, oxysulfonyl ketones, sulfonyl ketones, benzoyl oxime esters, camphorquinones, ketocoumarins, Michler's ketone, halogenated alkyl aryl ketones, α-hydroxy-α-cyclohexyl phenyl ketone and combinations of one or more of the foregoing. In a particularly preferred embodiment, the photoinitiator for the second photocurable composition comprises 2,2-dimethoxy-2-phenyl acetophenone (MDPAP).

The binder or oligomer preferably comprises an A-B-A type block copolymer where A represents a non-elastomeric block, preferably a vinyl polymer or most preferably polystyrene, and B represents an elastomeric block, preferably polybutadiene or polyisoprene. Suitable polymerizable oligomers may also be used in the compositions of the invention and preferred oligomers include those that are polymerized from the monofunctional and/or polyfunctional monomers disclosed above. Particularly preferred oligomers include epoxy acrylates, aliphatic urethane acrylates, aromatic urethane acrylates, polyester acrylates, polyether acrylates, amine modified polyether acrylates and straight-chained acrylic oligomers.

Other optional ingredients for use in the first photopolymer and the second photopolymer of the invention include inhibitors, plasticizers, dyes, polymers, oligomers, pigments, sensitizers, synergists, tertiary organic amines, UV absorbers, thixotropes, anti-oxidants, oxygen scavengers, flow modifiers, fillers and combinations of one or more of the foregoing.

The crosslinking is carried out by irradiation with actinic, i.e. chemically effective, radiation. Particularly suitable radiation is UV-A radiation having a wavelength of from 320 to 400 nm, or UV-A/VIS radiation having a wavelength of from 320 to about 700 nm.

The first photopolymer comprising the silicone monomer or silicone oil is extruded or otherwise disposed on the backing layer.

Thereafter, the second photopolymer is extruded or otherwise disposed on top of the first photopolymer. As described herein, the first photopolymer comprises a photocurable composition similar to the photocurable composition of the second photopolymer layer but further comprises a silicone monomer or silicone oil. The first photopolymer is subjected to a blanket exposure to actinic radiation to crosslink and cure the first photopolymer at least in part to create the cured floor layer. As described herein, this floor layer sets the depth of relief for the imageable cap layer. The first photopolymer preferably has a surface energy of between about 18 and about 25 dynes/cm when cured. This cured floor layer has a much lower surface energy than the second photopolymer layer and is thus able to avoid picking up significant amounts of paper fibers, dust and ink during a print run.

The source of the silicone in the matrix of the first photopolymer is preferably either a silicone monomer or a silicone oil. In one embodiment, the source of silicone is selected from the group consisting of silicone oil, aliphatic silicone(meth)acrylate, silicone p-ethyl(meth)acrylate, silicone(meth)acrylate, silicone polyester(meth)acrylate, silicone diacrylate, silicone hexacrylate, and combinations of one or more of the foregoing.

The silicone monomers or silicone oil are preferably used in the formulation of the first photopolymer at a concentration of between about 0.1 and about 2% by weight, more preferably at a concentration of between about 0.5 and about 1% by weight.

The backing (or support) layer lends support to the plate and can be formed from a transparent or opaque material such as paper, cellulose film, plastic, or metal. The backing layer is preferably formed from a variety of flexible, transparent materials. Examples of such materials are cellulose films, or plastics such as, for example, PET (polyethylene terephthalate), PEN (polyethylene naphthalate), polyether, polyethylene, polyamide (Kevlar) or nylon. Preferably, the support layer is formed from polyethylene terephthalate (PET). It was also surprisingly found that the second photocurable layer was able to adhere to the support layer. The support layer can be from about 0.001 to about 0.010 inches thick.

Optionally, various layers, such as an antihalation layer or an adhesive layer may be positioned between the backing layer and the first photopolymer layer.

In one embodiment, a laser ablatable mask layer is disposed between the second photopolymer and the removable coversheet. In DTP technology, a computer transfers digital information to the laser ablatable mask layer via a laser that is in communication with the computer that ablates those areas of the laser ablatable mask layer that have to cure, i.e., those areas that ultimately become the relief layer. The plate is then face exposed through the in-situ mask, and developed. The area of the laser ablatable mask layer that was not ablated prevents the underlying photopolymer from curing and is removed during the processing (development) step. That area where the mask was laser ablated is cured and becomes the relief area. The plate is then dried and post-exposed and de-tacked as usual. Examples of laser ablatable mask layers are disclosed in, for example, U.S. Pat. No. 5,925,500 to Yang, et al., herein incorporated by reference, which discloses slip films modified with a UV absorber as the mask layer, thus employing a laser to selectively ablate the modified slip film; and U.S. Pat. Nos. 5,262,275 and 6,238,837 to Fan, the subject matter of each of which is herein incorporated by reference in its entirety.

In the alternative, the second photopolymer is imaged through a negative that is placed on the second photopolymer after removal of the coversheet. The plate and negative are then subjected to flood-exposure by UV light through the negative. The areas exposed to the light cure, or harden, and the unexposed areas are removed (developed) to create the relief image on the printing plate. A slip film or, a matte layer may also be used to improve the ease of plate handling. The matte layer typically comprises fine particles (silica or similar) suspended in an aqueous binder solution. The matte layer is coated onto the second photopolymer layer and then allowed to air dry. A negative is then placed on the matte layer for subsequent UV-flood exposure of the photocurable layer.

The first photocurable composition and the second photocurable composition of the invention should cross-link (cure) and, thereby, harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions are from about 250 nm to about 450 nm, more preferably from about 300 nm to about 400 nm, even more preferably from about 320 nm to about 380 nm.

Once the printing element has been imagewise exposed to actinic radiation to create the relief image, the printing element is developed to remove the unpolymerized portions and reveal the crosslinked relief image. Typical methods of development include washing with various solvents or water, often with a brush. Other possibilities for development include the use of an air knife or heat plus a blotter (thermal development). The resulting surface has a relief pattern that reproduces the image to be printed. The relief pattern typically comprises a plurality of dots, and the shape of the dots and the depth of the relief, among other factors, affect the quality of the printed image. After the relief image is developed, the relief image printing element may be mounted on a press and printing commenced.

Most flexographic printing plates are also uniformly post-exposed to ensure that the photopolymerization process is complete and that the plate will remain stable during printing and storage. This post-exposure step utilizes the same radiation source as the main exposure.

Detackification (which can also be referred to as light finishing) is an optional post-development treatment which can be applied if the surface is still tacky, such tackiness not generally being removed in post-exposure. Tackiness can be eliminated by methods known in the art, such as treatment with bromine or chlorine solutions.

The inventors of the present invention determined that silicones can form networks generated from free radicals generated by UV light and a free radical photoinitiator. One exemplary photoinitiator that was found to produce a good results in the first photocurable composition is 2,2-dimethoxy-2-phenyl acetophenone. Other similar photoinitiators and classes of photoinitiators would also be usable in the compositions described herein.

EXAMPLE

A print trial was conducted using a conventional capped printing plate (Digital Epic, available from MacDermid Printing Solutions) as a control. Printing plate formulations were also prepared using 1% of each of the silicone monomers and silicone oil in the formulation listed in Table 1 as the floor layer and with a cap layer placed on top of the silicone-containing floor layers.

TABLE 1

Silicone plate types

| Silicone | Manufacturer | Type |
| --- | --- | --- |
| PMX200 | Xiameter/Dow Corning | Silicone oil |
| CN9800 | Sartomer | Aliphatic silicone acrylate |
| TR2300 | Degussa/Tego | Silicone p-ethyl acrylate |
| TR2700 | Degussa/Tego | Silicone acrylate |
| SIP900 | Miwon/Rahn | Silicone polyester acrylate |
| EB350 | Cytec | Silicone diacrylate |
| EB1360 | Cytec | Silicone hexacrylate |

After the print trial, the plates were purposefully not washed in order to observe how the ink held on the plates. In particular, it was desirable to see if the ink would bead on the plate surface and whether the plate floor had ink on it.

Table 2 summarizes the attributes of the silicon containing formulations as compared with the conventional cap plate. The surface energies were generated using an ACCU DYNE TEST™ pen kit. As can be observed from the results in Table 2, the floor of a standard Digital Epic plate (available from MacDermid Printing Solutions) had a surface energy measured to be about 40 dynes/cm and the cap was measured at about 50 dynes/cm. In contrast, the plate formulations containing the various silicone monomers or silicone oil in the first photopolymer layer had values for surface energy that were much lower.

TABLE 2

Summary of Silicon Formulation Attributes.

| Plate | SID | 10% dot | 40% dot | 5 mil space | 15 mil reverse | 30 mil reverse | Cap dynes/ cm | Floor dynes/ cm |
|---|---|---|---|---|---|---|---|---|
| DEpic | 1.29 | full | full | full | 8.2 | 14.3 | 50 | 40 |
| TR2300 | 1.31 | none | part | n/a | 5.5 | 7.6 | <30 | 20-21 |
| TR2700 | 1.31 | none | full | clean | 3.2 | 4.1 | 32 | 20-21 |
| PMX200 | 1.36 | none | part | clean | 2.5 | 3.5 | 50 | 21-22 |
| SIP900 | 1.36 | bead | few | clean | 6.0 | 8.3 | 32 | 21-22 |
| EB350 | 1.38 | none | part | clean | 4.9 | 6.3 | 34 | 21-22 |
| EB1360 | 1.33 | bead | most | part | 5.6 | 7.8 | 36 | 21-22 |
| CN9800 | 1.33 | none | part | clean | 5.0 | 6.5 | 32 | <20 |

The result of the print trial indicated that the use of silicone monomers in a floor layer of a sheet printing plate produces a good image that is capable of printing cleanly and without picking up significant amounts of paper fibers, dust and ink during a print run. The use of a cap layer comprising photocurable composition that has a higher surface energy than that of the floor layer provides a unique opportunity to separate the plate into two distinct surface energies.

What is claimed is:

1. A flexographic relief image printing element comprising:
   a) a backing layer;
   b) a first photopolymer layer disposed directly on the backing layer and comprising a first photopolymer comprising a silicone monomer or silicone oil;
   c) a second photopolymer layer disposed directly on the first photopolymer layer and comprising a second photopolymer that is capable of being imagewise exposed to actinic radiation to create a relief image therein, wherein the second photopolymer layer has a surface energy which is at least 5 dynes/cm higher than the surface energy of the first photopolymer layer when the layers are cured; and
   d) a removable cover sheet;
   wherein the second photopolymer layer does not include silicone oil or a silicone monomer.

2. The flexographic relief image printing element according to claim 1, wherein the silicone monomer is selected from the group consisting of aliphatic silicone (meth) acrylate, silicone p-ethyl (meth) acrylate, silicone (meth) acrylate, silicone polyester (meth) acrylate, silicone diacrylate, silicone hexacrylate, and combinations of one or more of the foregoing.

3. The flexographic relief image printing element according to claim 1, wherein the silicone oil or the silicone monomer is present in the first photopolymer layer at a concentration of between about 0.1 to about 2% by weight.

4. The flexographic printing element according to claim 3, wherein the silicone oil or silicone monomer is present in the first photopolymer layer at a concentration of between about 0.5 to about 1.0% by weight.

5. The flexographic relief image printing element according to claim 1, wherein the surface energy of the second photopolymer layer is between about 30 to about 40 dynes/cm when it is cured.

6. The flexographic relief image printing element according to claim 1, wherein the surface energy of the first photopolymer layer is between about 18 to about 25 dynes/cm when it is cured.

7. The flexographic relief image printing element according to claim 1, wherein the backing layer comprises polyethylene terephthalate.

8. The flexographic relief image printing element according to claim 1, comprising a laser ablatable mask layer disposed between the second photopolymer layer and the removable coversheet.

9. A method of making a flexographic relief image printing plate, the method comprising the steps of:
   a) disposing a first photopolymer composition onto a backing layer, wherein the first photopolymer composition comprises a silicone monomer or silicone oil;
   b) disposing a second photopolymer composition on top of the first photopolymer composition, wherein the second photopolymer composition does not include silicone oil or a silicone monomer;
   c) exposing the first photopolymer composition to actinic radiation through the backing layer to crosslink and cure at least a portion of the first photopolymer composition;
   d) imagewise exposing the second photopolymer composition to actinic radiation from the top to create the relief image therein.

10. The method according to claim 9, wherein the silicone monomer is selected from the group consisting of, aliphatic silicone (meth) acrylate, silicone p-ethyl (meth) acrylate, silicone (meth) acrylate, silicone polyester (meth) acrylate, silicone diacrylate, silicone hexacrylate, and combinations of one or more of the foregoing.

11. The method according to claim 9, wherein the silicone oil or the silicone monomer is present in the first photopolymer composition at a concentration of between about 0.1 to about 2% by weight.

12. The method according to claim 11, wherein the silicone oil of silicone monomer is present in the first photopolymer composition at a concentration of between about 0.5 to about 1.0% by weight.

13. The method according to claim 9, wherein the surface energy of the second photopolymer composition is at least 5 dynes/cm higher than the surface energy of the first photopolymer composition when the compositions are cured.

14. The method according to claim 13, wherein the surface energy of the second photopolymer composition is between about 30 to about 40 dynes/cm when cured and wherein the surface energy of the first photopolymer composition is between about 18 to about 25 dynes/cm.

15. The method according to claim 9, wherein the backing layer comprises polyethylene terephthalate.

16. The method according to claim 9, comprising the additional step of disposing a laser ablatable mask layer on the second photopolymer composition.

17. The method according to claim 9, further comprising the step of developing the relief image printing element to remove uncured portions and reveal the relief image therein.

18. A flexographic relief image printing element comprising:
   a) a backing layer;
   b) a first photopolymer layer disposed directly on the backing layer and comprising a first photopolymer comprising a silicone monomer or silicone oil;
   c) a second photopolymer layer disposed directly on the first photopolymer layer and comprising a second photopolymer that is capable of being imagewise exposed to actinic radiation to create a relief image therein; and
   d) a removable cover sheet;
   wherein the second photopolymer layer does not include silicone oil or a silicone monomer.

19. A flexographic relief image printing element according to claim 18 further comprising a laser ablatable mask layer between the second photopolymer layer and the removable cover sheet.

* * * * *